US008892225B2

(12) United States Patent
Walsh et al.

(10) Patent No.: US 8,892,225 B2
(45) Date of Patent: *Nov. 18, 2014

(54) WIDEBAND PERSONAL-RADIO RECORDER

(75) Inventors: Brendan Walsh, Carlsbad, CA (US);
Stefan Szasz, Carlsbad, CA (US);
Madhukar Reddy, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 684 days.

This patent is subject to a terminal disclaimer.

(21) Appl. No.: 12/762,950

(22) Filed: Apr. 19, 2010

(65) Prior Publication Data

US 2011/0096874 A1    Apr. 28, 2011

Related U.S. Application Data

(60) Provisional application No. 61/170,526, filed on Apr. 17, 2009, provisional application No. 61/170,539, filed on Apr. 17, 2009.

(51) Int. Cl.
*G06F 17/00* (2006.01)
*H04B 7/12* (2006.01)
(Continued)

(52) U.S. Cl.
CPC ............ *H03D 7/165* (2013.01); *H04L 27/3818* (2013.01); *H04H 60/27* (2013.01); *H04H 40/18* (2013.01); *H04B 1/0007* (2013.01); *H04H 60/37* (2013.01); *H04H 2201/60* (2013.01); *G11B 27/28* (2013.01); *H04N 21/458* (2013.01); *H04H 60/13* (2013.01)
USPC .............. 700/94; 455/141; 455/146; 455/323

(58) Field of Classification Search
CPC ..... H03D 7/165; H03D 3/007; H04B 1/0032; H04B 1/0007–1/0021; H04B 1/0067; H04B 1/0082; H04B 1/0071; H04L 27/3818–27/3836; H04H 60/27; H04H 60/37; H04H 60/74; H04H 2201/13; H04H 2201/60; G11B 27/28; H04N 21/458; H03B 27/00
USPC ........... 700/94; 455/66.1, 131, 141, 146, 149, 455/207, 276.1, 323
See application file for complete search history.

(56) References Cited

U.S. PATENT DOCUMENTS 5,590,156 A    12/1996  Carney
5,705,949 A     1/1998  Alelyunas et al.
(Continued)

OTHER PUBLICATIONS

Non-Final Office Action for U.S. Appl. No. 12/762,900, mailed on Aug. 30, 2012, 12 pages.
(Continued)

*Primary Examiner* — Jesse Elbin
(74) *Attorney, Agent, or Firm* — Ardeshir Tabibi, Esq.; Kilpatrick Townsend & Stockton LLP

(57) ABSTRACT

Methods and apparatuses for concurrently recording multiple radio channels. A recorder includes a wideband tuner having a complex mixer for converting a received wideband RF signal to a complex signal that is then digitized. A digital front end module applies a number of complex down-mixers to the digital complex signal to generate the multiple radio channels in the baseband. Each one of the multiple radio channels in the baseband is further filtered, decimated and demodulated. A digital signal processing unit encodes each demodulated channel according to an audio compression format and stores the then encoded audio content to a storage unit. An RBDS decoder parses radio data service information associated with the stored audio content. The radio data service information is stored in a first section of the storage unit while the encoded audio content is stored in a second section of the storage unit.

26 Claims, 5 Drawing Sheets

(51) Int. Cl.
*H03J 7/32* (2006.01)
*H04B 15/06* (2006.01)
*H03D 7/16* (2006.01)
*H04L 27/38* (2006.01)
*H04H 60/27* (2008.01)
*H04H 40/18* (2008.01)
H04B 1/00 (2006.01)
H04H 60/37 (2008.01)
G11B 27/28 (2006.01)
H04N 21/458 (2011.01)
H04H 60/13 (2008.01)

(56) References Cited

U.S. PATENT DOCUMENTS

| | | | |
|---|---|---|---|
| 5,768,260 | A | 6/1998 | Kline et al. |
| 6,253,094 | B1 | 6/2001 | Schmutz |
| 6,262,981 | B1 | 7/2001 | Schmutz |
| 6,282,184 | B1 | 8/2001 | Lehman et al. |
| 6,735,421 | B1 | 5/2004 | Claxton et al. |
| 6,760,342 | B1 | 7/2004 | Skones et al. |
| 6,920,185 | B2 | 7/2005 | Hinson |
| 2003/0158614 | A1 | 8/2003 | Friel et al. |
| 2003/0228855 | A1 | 12/2003 | Herz et al. |
| 2004/0058661 | A1 | 3/2004 | Hsu et al. |
| 2004/0110522 | A1* | 6/2004 | Howard et al. ............ 455/512 |
| 2005/0286562 | A1* | 12/2005 | Nakao et al. ............... 370/477 |
| 2007/0002961 | A1 | 1/2007 | Hoctor et al. |
| 2007/0032220 | A1 | 2/2007 | Feher |
| 2007/0179649 | A1 | 8/2007 | Mitsuno |
| 2007/0263754 | A1 | 11/2007 | Currivan et al. |
| 2009/0075613 | A1 | 3/2009 | Safarian et al. |
| 2009/0258629 | A1 | 10/2009 | Ritchey et al. |
| 2011/0105068 | A1 | 5/2011 | Reddy et al. |

OTHER PUBLICATIONS

U.S. Appl. No. 12/762,900, filed Apr. 19, 2010, Reddy et al.
International Search Report of the International Searching Authority for Application No. PCT/US2010/031627, mailed on Jun. 18, 2010, 2 pages.
Written Opinion of the International Searching Authority for Application No. PCT/US2010/031627, mailed on Jun. 18, 2010, 5 pages.
International Search Report of the International Searching Authority for Application No. PCT/US2010/031631, mailed on Jun. 17, 2010, 2 pages.
Written Opinion of the International Searching Authority for Application No. PCT/US2010/031631, mailed on Jun. 17, 2010, 6 pages.
Notice of Allowance for U.S. Appl. No. mailed on 12/762,900, mailed on May 6, 2013, 9 pages.

* cited by examiner

WIDEBAND PERSONAL-RADIO RECORDER

CROSS-REFERENCES TO RELATED APPLICATIONS

The present application claims benefit under 35 USC 119 (e) of U.S. provisional application No. 61/170,539, filed Apr. 17, 2009, entitled "Wideband Personal-Radio Recorder," and U.S. provisional application No. 61/170,526, filed Apr. 17, 2009, entitled "Wideband Tuner Architecture," the content of both of which applications are incorporated herein by reference in their entirety. The present application is related to U.S. application Ser. No. 12/762,900, filed Apr. 19, 2010, entitled "Wideband Tuner Architecture," the content of which is incorporated herein by reference in its entirety.

BACKGROUND OF THE INVENTION

The present invention relates to the field of multimedia recording and playback and specifically to systems, devices and methods of concurrently storing the content of several broadcast radio channels and allowing a selected playback of the stored audio information in a "time-shifted" manner at the discretion of a user.

The conventional audio recorder has provided many desirable features to a user. When listening to pre-recorded programs, the user may pause the playback, advance, fast-forward, or rewind the recorded program to an area of interest. As best understood, current radio program recorders require the user to tune in a desired station and activate a tape recorder or CD recorder to record the selected program. That is, radio program recorders cannot both record and playback a desired program at the same time. Furthermore, current radio program recorders cannot record several programs at the same time. Additionally, current radio recorders do not permit the user to navigate through the library with both visual cues via a graphics user interface (GUI) as well as audio cues to enable access while engaging another activity such as driving. As well, current radio receivers must scan the radio spectrum one station at a time; this is a time-consuming process which is an inconvenience to the user of such a device.

It is therefore desirable to provide these features to the user.

BRIEF SUMMARY OF THE INVENTION

In accordance with embodiments of the present invention, one or more radio programs are concurrently received, down-mixed, digitized, demodulated, compressed, and stored in a storage unit without intervention from the user. The one or more programs may be stored together with the associated Radio Broadcast Data Service (RBDS) information.

The present invention advantageously provides a wideband recorder that can concurrently records multiple radio programs and allows a user to listen to a selected channel in real time. In an embodiment, the wideband recorder includes a radio front end module for concurrently receiving multiple radio channels and convert the multiple channels to a complex signal having an in-phase signal and a quadrature signal. The wideband receiver further includes an analog-to-digital converter module for digitizing the complex signal and a digital front end module having multiple complex mixers for frequency down-shifting the digitized complex signal to a number of desired radio channels in a baseband. The wideband receiver further includes a demodulator module that demodulates the number of desired radio channels in the baseband to a corresponding number of data streams and a digital signal processing circuitry to encode the number of data streams. In addition, the wideband recorder includes a storage unit for storing the encoded number of data streams and a control circuitry having a digital interface port for receiving control commands from the user. In an embodiment, the storage unit may be a flash memory, the digital signal processing unit may include at least a decoding engine for reproducing an audio signal from one of the stored and encoded data streams for playback. In another embodiment, the wideband recorder may have a built-in battery that supplies power to the recorder. In yet another embodiment, the wideband recorder may include an output unit that include a USB or FireWire audio interface or a wireless port for communicating with a third-party audio device. In yet another embodiment, the wideband receiver digitally processes the concurrently-received multiplicity of radio channels to rapidly assess the occupancy (e.g., assigned carrier frequency), location of the broadcast station, identity (e.g, program service name), and contents (types of music such as jazz, classics, traffic announcements, speech, etc.) of channels occupying the entire radio spectrum.

In an alternative embodiment, the invention provides a multi-tuner wideband recorder that includes at least a first tuner and a second tuner. The first tuner is configured to receive a first frequency spectrum having a first plurality of radio channels and convert the first frequency spectrum to a first complex signal. The second tuner is configured to receive a second frequency spectrum having a second plurality of radio channels and convert the second frequency spectrum to a second complex signal. The multi-tuner wideband recorder further includes at least a first analog-to-digital converter module for digitizing the first complex signal and a second analog-to-digital converter module for digitizing the second complex signal. In addition, the multi-tuner wideband recorder includes at least a first digital front end having a first number of digital complex mixers for frequency down-shifting the first complex signal to a corresponding first number of radio channels in a baseband and a second digital front end having a second number of digital complex mixers for frequency down-shifting the second complex signal to a corresponding second number of radio channels in the baseband. The multi-tuner wideband recorder additionally includes a demodulator module for demodulating the first and second numbers of radio channels in the baseband to obtain a plurality of data streams, wherein the plurality of data streams corresponds to the first and second numbers of radio channels. Furthermore, the multi-tuner wideband recorder includes a digital signal processing circuitry for encoding the plurality of data streams and a storage unit for storing the encoded plurality of data streams. In an embodiment, the digital signal processing circuitry may include at least a decoding engine for reproducing an audible audio signal from one of the stored and encoded data streams for playback. In another embodiment, the wideband recorder may include a built-in battery that supplies power to the recorder. In yet another embodiment, the wideband recorder may include an output unit that may include a USB or FireWire audio interface or a wireless port for communicating with a third-party audio device.

BRIEF DESCRIPTION OF THE DRAWINGS

Other aspects and advantages of the invention will become apparent from the following detailed description in combination with the accompanying drawings, in which.

DETAILED DESCRIPTION OF THE INVENTION

The present invention provides wideband personal radio recorder architectures and associated methods that concurrently extract multiple radio channels within a received frequency spectrum. In the description of the present invention below, the frequency spectrum is described with respect to an FM frequency spectrum. However, it is understood that the recording architectures and methods can be used with other frequency spectrums utilized by other radio channels.

Figure 1:
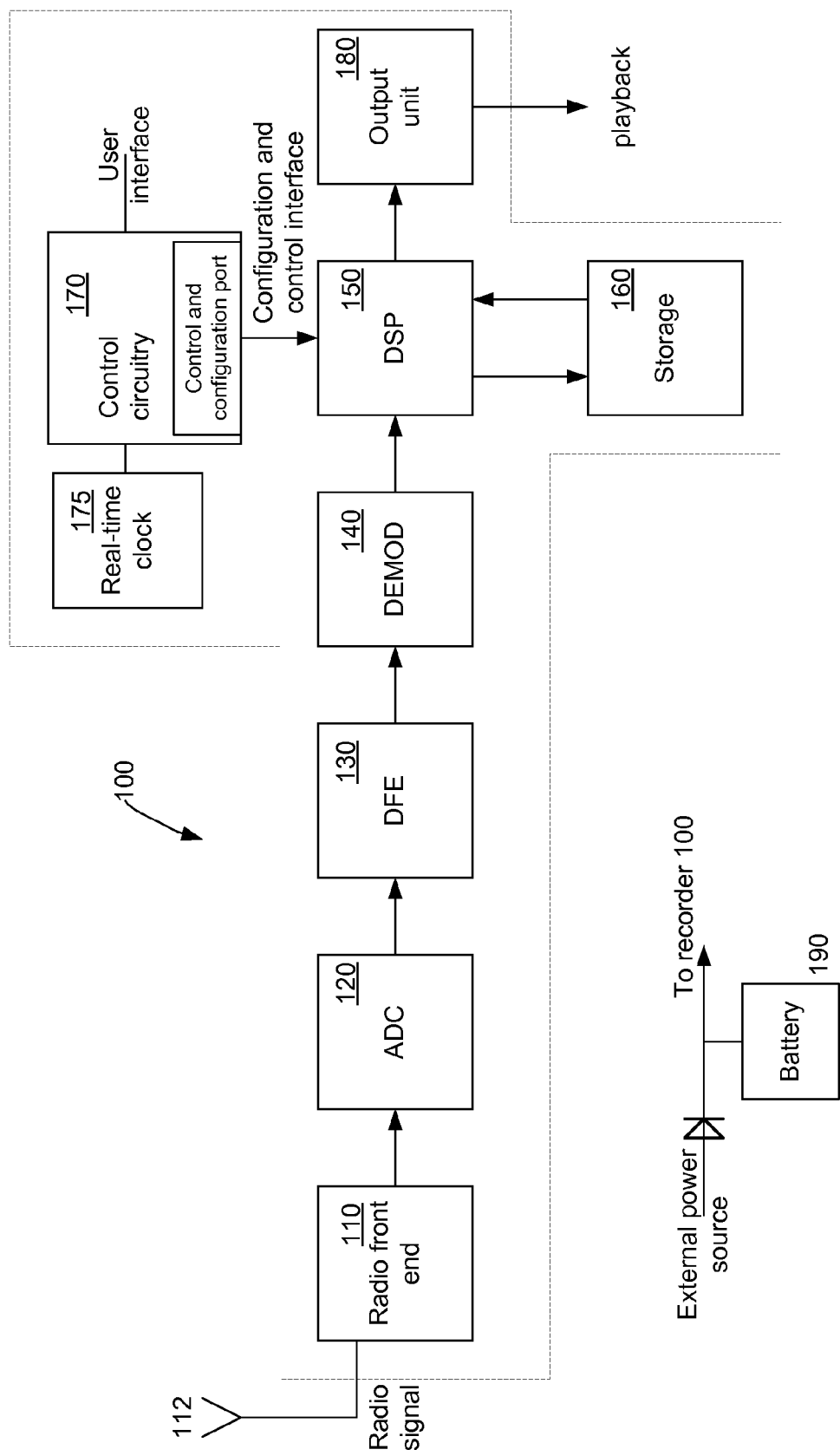
FIG. 1 is a block diagram of a basic wideband radio recorder architecture according to an embodiment of the present invention.

FIG. 1 is a block diagram of a basic architecture of a wideband radio recorder 100 according to an embodiment of the present invention. Wideband radio recorder 100 is shown as including a radio front end 110 for receiving and down-mixing one or more programs, an analog-to-digital converter ADC 120, a digital front end DFE 130, a demodulator 140, a digital signal processing circuitry 150 for data compression and decompression, a storage unit 160 that may include a combination of a disk storage, a semiconductor random access memory (RAM), a flash memory for enabling immediate access to a stored program, a control circuitry 170 for receiving control commands from the user, a real-time clock 175 to permit the user to set the recording time, and an output unit 180 for playing back a stored program.

Radio front end 110 is shown as coupled to an antenna 112 and is configured to receive a radio frequency (RF) signal. The RF signal may include, in an example, frequency modulated (FM) radio channels between 87.5 MHz and 108 MHz. In another example, the RF signal may include radio broadcasting in digital format such as the Eureka-147 digital audio broadcast system, In Band On Channel (IBOC), FMextra, and Digital Radio Mondiale. In an exemplary embodiment, the RF signal may include only one type of modulation. In another exemplary embodiment, the RF signal may include two or more types of modulations. The RF signal is processed by radio front end 110. In an embodiment, radio front end 110 includes a radio tuner. In another embodiment, radio front end 110 may include two or more tuners. In general, tuners are radio frequency receivers that receive radio broadcasting channels and convert them into audio and/or video frequency signals.

In certain embodiments, radio front end 110 can be a direct down-conversion architecture or an intermediate frequency (IF) down-conversion architecture. In an embodiment, radio front end 110 may include a mixer module having two mixers in quadrature for converting the RF signal into a complex signal having an in-phase signal and a quadrature signal.

Analog-to-digital converter 120 samples the complex signal at a first sampling rate to produce a digital representation of the in-phase and quadrature signals. The digital complex signal is provided to a digital front end module 130 that may include a signal strength detector for detecting radio channels having a received signal strength that exceeds a predetermined signal level. In an embodiment, only the radio channels having a sufficient signal strength exceeding the predetermined signal strength will be further processed. In another embodiment, only preselected radio channels will be processed. Digital front end module 130 frequency shifts the preselected radio channels to a baseband. Each one of these radio channels in the baseband is individually filtered and decimated at a second sampling rate that is lower than the first sampling rate.

Demodulator 140 that may include multiple demodulators each adapted to demodulate one of the decimated radio channels to generate a corresponding digital audio data stream. In an embodiment, each one of the decimated in-phase and quadrature signals in the baseband may be time-multiplexed into a corresponding serial in-phase data stream and a serial quadrature data stream that are then demodulated by the demodulator module 140 to produce a single digital audio data stream. In another embodiment, the demodulator demodulates each one of the in-phase and quadrature signals to a corresponding audio stream in parallel to provide them to a digital signal processing circuitry 150 concurrently, where each one of the demodulated audio data stream is encoded individually according to a predetermined encoding format. The encoded digital data streams are then time-multiplexed and stored in a storage unit 160.

Control circuitry 170 has an interface port for communicating with a user and a control port for configuring and controlling digital signal processing circuitry 150. The user may interface with the recorder 100 through the user interface port by using push buttons, knobs, and visual displays for performing functions such as fast forward, reverse or pause the playback, etc. as is known in the art for allowing user interaction with a recorder.

Real-time clock 175 provides accurate time to enable the user to preset times of the day for recording certain channels. The user may also schedule recordings of certain programs in the future. In the event that these programs recur regularly, the user may schedule the periodic recording of such programs. In the event that these programs do not recur periodically, the user may set the recording of such programs via the radio broadcast data system (RBDS) or other relevant data to record any showing of such programs.

Digital signal processing circuitry 150 monitors the received RBDS information and triggers the encoding and recording. Control unit 170 may monitor the available capacity of storage unit 160 to generate a warning to the user in the event that storage unit 160 does not have sufficient storage space for recording all desired channels. In this case, the user may set priorities to resolve this issue or delete certain recorded areas to make additional storage space available or to activate an encoding or compression algorithm in digital signal processing module 150 to reduce the data rate of the data stream, thus, the amount of data to be stored. In an embodiment, digital signal processing circuitry 150 may also contain software program codes for scanning the radio spectrum, which has been digitally captured by the wideband radio receiver in order to assess the occupancy (e.g. whether a radio channel occupies a particular portion of the spectrum), location of the broadcast station, identity (what radio station is broadcasting in that portion of the spectrum, if any), and contents (what song is playing at the particular moment) of the entire radio spectrum efficiently.

Control circuitry 170 may further include a graphical user interface (GUI) to a display, such as in the car stereo, to present information related to the content that is currently being broadcasted. The information may include a station identification, the artist name, the title of the song, and others. Control circuitry 170 may include software program codes for managing and displaying a directory of contents stored in storage unit 160 and thus enabling the user to initiate a playback request.

Output unit 180, coupled to digital signal processing circuitry 150, may include a digital-to-analog converter that is coupled with an audio amplifier for playing back the demodulated audio signal without going through the encoding process. In some embodiments, output unit 180 may include a wired or wireless link to send the audio stream directly to a remote third-party device.

In an embodiment, recorder 100 is coupled to a battery 190 that enables a continual recording of the desired programs when the external (main) power source to the recorder is turned off, as it is the case when the recorder is part of a car audio system and the car is parked and shut off. This permits the user of the recorder to continue her listening experience when she returns to the car.

Radio broadcasting based on frequency modulation (FM) are well known in the art. In the commercial FM radio spectrum of 88.0 MHz to 107.9 MHz, there are 140 possible FCC licensed FM frequencies in a given geographic area. In practice, the FCC limits station coverage due to interference between adjacent stations so that there are less active channels in the FM radio spectrum. In other words, the receivable FM radio channels are located in non-contiguous portions of the FM frequency spectrum.

Figure 2A:
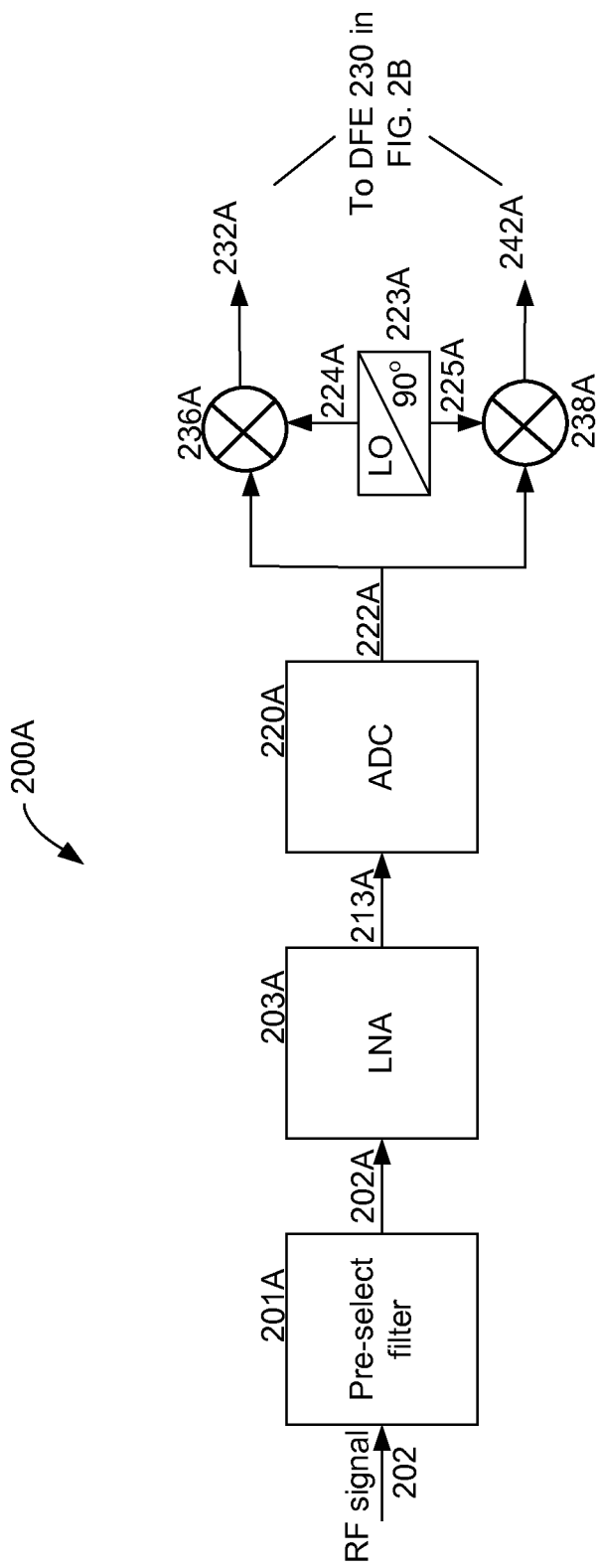
FIG. 2A is a simplified schematic block diagram of a wideband receiver according to an embodiment of the present invention.

FIG. 2A is a simplified schematic block diagram of a wideband receiver 200A according to an embodiment of the present invention. Wideband receiver 200A is a front end part of wideband radio recorder 100 and may encompass radio front end 110 and analog-to-digital converter 120. In an embodiment, wideband receiver 200A includes a pre-select filter 201A configured to pass through a desired frequency spectrum 202A, a low-noise amplifier 203A, and a wideband analog-to-digital converter ADC 220A. ADC 220A may support very high spurious-free dynamic ranges. In an embodiment, high dynamic wideband ADC 220A can be a delta-sigma modulator having a large oversampling ratio. For example, an embodiment of the present invention can be a direct sampling tuner that may provide improved signal recovery performance and programmable flexibility comparing with an analog RF down-converter architecture. Wideband receiver 200A advantageously avoids the use of analog mixing operations.

Thus, wideband ADC 220A samples a filtered and amplified RF signal 213A into a digital representation 222A that is then processed in the digital domain. Digital mixers 236A and 238A multiply (mix) sampled signal 222A with respective oscillation signals 224A and 225A to generate an in-phase signal 232A and a quadrature signal 242A. In-phase and quadrature signals 232A and 242A are provided to a subsequent DFE 230 (shown in FIG. 2B) for further processing. Oscillation signals 224A and 225A have substantially equal amplitude and a shift relation of 90 degree and may be generated from a local oscillator 223A.

Figure 2B:
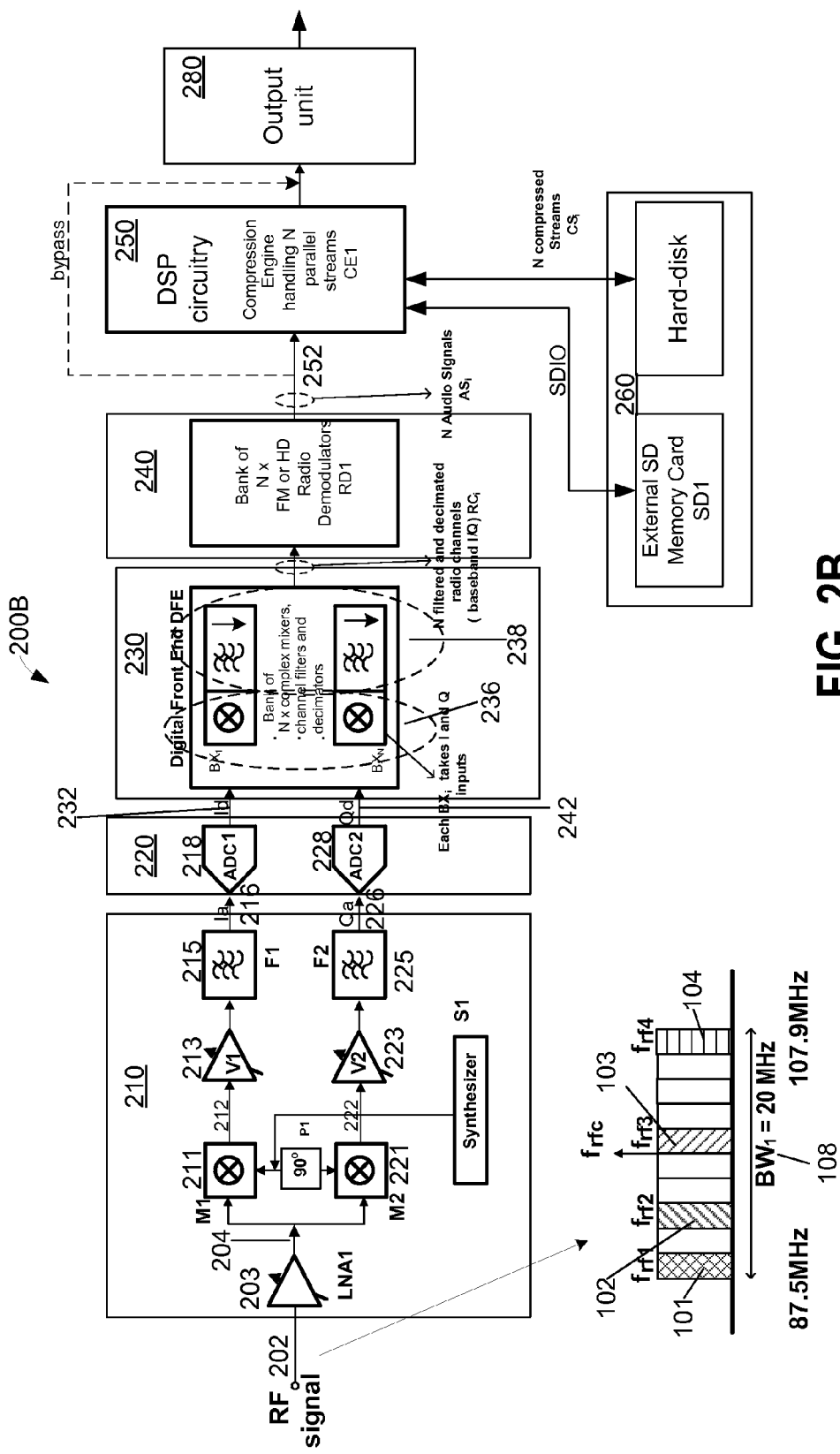
FIG. 2B is a simplified schematic block diagram of a wideband radio recorder according to an embodiment of the present invention.

FIG. 2B is a simplified schematic block diagram of a wideband radio recorder 200B according to an embodiment of the present invention. Wideband radio recorder 200B provides a more detailed hardware block diagram of some blocks of FIG. 1 including a wideband receiver 210 that receives an RF signal 202. In the example shown, RF signal 202 includes four desired radio channels 101, 102, 103, 104 having the respective carrier frequency $f_{rf1}$, $f_{rf2}$, $f_{rf3}$, and $f_{rf4}$ that are located non-contiguously within the FCC licensed bandwidth BW1 108. Wideband receiver 210 may include a low noise amplifier LNA1 203 having an input terminal configured to receive RF signal 202. LNA1 203 may have a programmable gain to set received RF signal 202 to an adequate voltage level for a mixer M1 211 and a mixer M2 221. Mixers M1 211 and M2 221 may be conventional mixers formed using, for example, differential Gilbert cells and mixes the amplified RF signal 204 with two significantly identical oscillation frequencies having equal amplitude and a phase shift of 90° between them. One of the oscillation frequencies is generated by a synthesizer S1 that may be a coarse (large step) phase locked loop operable to generate an oscillation frequency centered around the licensed FM bandwidth. An oscillation frequency of synthesizer s1 is coupled directly to mixer M1 211 and to a phase shifter P1 that generates a signal having a 90 degree phase shift relative to the phase of the signal generated by synthesizer s1. The 90° phase-shifted signal generated by phase shifter P1 is applied to mixer M2 221. Mixers M1 211 and M2 221 generate respective in-phase signal 212 and quadrature signal 222. Mixers M1 211 and M2 221 are substantially identical so that the in-phase and quadrature signals 212 and 222 have a substantially equal amplitude and a 90 degree phase shift.

In-phase and quadrature signals 212 and 222 are further amplified and filtered by respective amplifiers V1 213, V2 223 and filters F1 215, F2 225 to generate a filtered in-phase signal 216 and a filtered quadrature signal 226. Filters F1 215 and F2 225 may be passive or active low-pass filters or polyphase filters to eliminate unwanted frequency components of signals Ia 216 and Qa 226 before submitting them to an analog-to-digital converter (ADC) module 220. It is understood that the in-phase path 212 and the quadrature path 222 must have the same amplitude spectrum and maintain a fixed phase relationship, i.e., amplifiers V1 213, V2 223 and filters F1 215, F2 225 must be substantially identical. Because the two paths 216 and 226 are in quadrature, the spectral components from both positive and negative frequencies can be overlaid so that the bandwidth (cutoff frequency) of filters F1 215 and F2 225 can be reduced to one half of the BW1 bandwidth 108.

ADC module 220 includes analog-to-digital converters ADC1 218 and ADC2 228 that are high-speed (i.e., high sampling rate) converters to maximize the dynamic range. In an embodiment, wideband receiver 210 operates as a nominal zero-IF down-mixer (or direct down-conversion) so that signals Ia 216 and Qa 226 have a nominal bandwidth equal to one half of the RF signal bandwidth BW1 108 thanks to the complex down-mixer architecture. ADC1 218 generates a digital signal Id 232 that is a digital representation of the analog filtered signal Ia 216 and ADC2 228 generates a digital signal Qd 242 that is a digital representation of the analog filtered signal Qa 226. In practice, the sampling rate of ADC1 218 and ADC2 228 is chosen to be higher than the Nyquist sampling requirement, i.e., the filtered analog quadrature signals may be over-sampled in order to avoid aliasing of undesired signals into the digitized signals Id 232 and Qd 242.

Digital signals Id 232 and Qd 242 are then further processed in a digital front end DFE 230. In an embodiment, DFE 230 may include a signal strength detector for identifying received radio channels having a signal strength that exceeds a predetermined signal strength. DFE 230 further includes a bank of N complex mixers 236, wherein N is an integer value corresponding to the number of desired RF channels in the licensed FM spectrum 108. In the example shown, N would be equal to four corresponding to the four respective desired radio channels 101, 102, 103, 104 having respective carrier frequency $f_{rf1}$, $f_{rf2}$, $f_{rf3}$, and $f_{rf4}$ within BW1 108.

Each one of the bank of N complex mixers 236 processes the in-phase and quadrature signals Id 232 and Qd 242 to extract in-phase and quadrature signals associated with one of the desired radio channels and frequency-shift them to the baseband where they are individually filtered by a low-pass filter. Each one of the filtered channels can then be decimated and sent to demodulator module 240 through a serial or parallel digital interface for further processing. One path of digital front end 230 is described in more detail below in FIG. 3.

Figure 3:
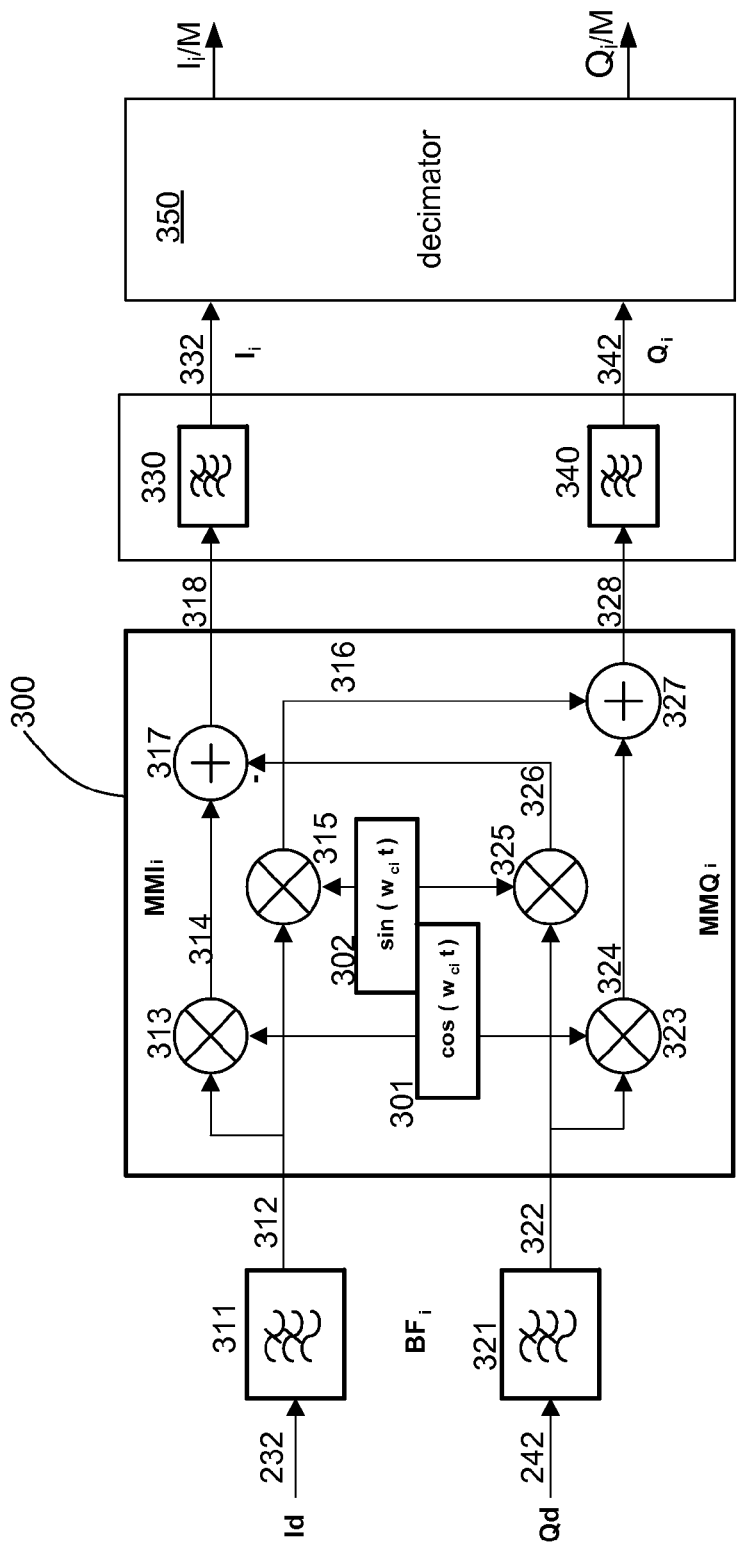
FIG. 3 is a simplified circuit diagram of a complex mixer according to an embodiment of the present invention.

FIG. 3 is a simplified circuit diagram of one path of digital front end 230 including one of the bank of N complex mixers 236 and associated filters and decimators in block 238 according to an embodiment of the present invention. In an embodiment, digital signal Id 232 may be further filtered by a filter 311 to obtain a filtered signal 312. Similarly, digital signal Qd 242 may be further filtered by a filter 321 to obtain a filtered signal 322. Thus, digital signals 312 and 322 only contain low frequency components with undesired high-frequency components being eliminated by filters 311 and 321. It is understood that filtered signals 312 and 322 are interposed between the respective ADC1 218 and ADC2 228 and the bank of N complex mixers 236. In an embodiment, the bank of N complex mixers 236 comprises N identical complex mixer 300, which is described in detail below.

Complex mixer 300 include four multipliers 313, 315, 323, and 325. Multipliers 313 and 315 multiply the filtered signal 312 with respective signals $\cos(\omega_{ci}t)$ 301 and $\sin(\omega_{ci}t)$ 302 and generate respective products 314 and 316. Similarly, multipliers 323 and 325 multiply the filtered Q signal 322 with respective signals $\cos(\omega_{ci}t)$ 301 and $\sin(\omega_{ci}t)$ 302 and generate respective products 324 and 326. An adder 317 sums the products 314 and 326 to produce a frequency-shifted signal I 318. An adder 327 sums the products 324 and 316 to produce a frequency-shifted signal Q 328. Basically, complex mixer 300 causes a frequency shift of the filtered components 312 and 322 to respective baseband signals 318 and 328 in the digital domain according to the operation:

$$Y(t)=X(t)*e^{-j\omega_c t} \quad (1)$$

or taken the Fourier transform, we obtain:

$$Y(\omega)=X(\omega-\omega_c) \quad (2)$$

Multipliers 313, 315, 317, and 325 are identical digital multipliers. In an embodiment, a numerically controlled oscillator with quadrature output generates the $\cos(\omega_{ci}t)$ and $\sin(\omega_{ci}t)$ signals. Numerically controlled oscillators (NCO) can be implemented using a phase accumulator and a look-up table. NCOs are known to those of skill in the art and will not be described herein. The frequency $\omega_{ci}$ is so chosen that each one of the desired channels contained in the digital signals Id 232 and Qd 242 will be downshifted to the baseband. In an embodiment, the frequencies $\omega_{ci}$, where index "i" is an integer corresponding to the number of desired channels, can be predetermined and the values of the $\cos(\omega_{ci}t)$ and $\sin(\omega_{ci}t)$ can also be predetermined and stored in a table or memory. In the given example shown in FIG. 2, the bank of complex mixers 236 will have four complex mixers, each one of the complex mixers is coupled to an individual NCO having a distinct frequency $\omega_{ci}$ so that when mixing the filtered digital signals I 312 and Q 322 with that frequency, each one of the complex mixers will produce the signals I (318) and Q (328) that correspond to one of the desired channels at the baseband.

In an embodiment, baseband signals 318 and 328 are further individually filtered by respective filters 330 and 340. Filters 330 and 340 may be low-pass filters having a narrow bandwidth (e.g., equal to or greater than one half of a desired FM channel bandwidth). The purpose of the filters 330 and 340 is to filter out noise that could be aliased back into the baseband during decimation. In certain embodiments, filters 330 and 340 can be finite impulse response (FIR) filters. In other embodiments, filters 330 and 340 can be analog or active low-pass filters. The low-pass filtered signals Ii (332) and Qi (342) can then be decimated at a decimator 350 in order to avoid aliasing when lowering the sampling rate of the digitally oversampled signal Id 232 and Qd 242 after the high sampling rate analog-to-digital converters ADC1 218 and ADC2 228. Decimator 350 down-samples the signals 332 and 342 such that the sampling data rate can be reduced by a factor M, where M is greater than 1. Thus, decimator 350 provides data output at a lower sampling rate.

The reduced sampling rate of the N desired baseband channels can be sent together as 2N individual digital data streams (a decimated I data stream and a decimated Q data stream per desired channel) to demodulator module 240 using a serial or parallel data interface according to commonly known methods.

It is understood that the complex mixing at radio front end allows the use of two lower speed ADC1 218 and ADC2 228 comparing to the simple mixing which requires a single ADC with twice the sampling rate. Digital front end 230 with the bank of N complex mixers 236 also allows the following demodulator module to operate at much lower clock frequency. Thus, the architecture of the present invention provides several advantages over conventional tuner architectures. First, it eliminates the need of expensive high-sampling rate data conversion, filtering and channel selection on the demodulator side. Second, it removes undesired channels from the signal path at an early stage, thus relieves the large dynamic range requirement in the demodulator module.

Shown in FIG. 2B, the N demodulated audio data streams 252 are further processed by digital processing circuitry 250. Digital signal processing circuitry 250 includes a compression engine that is capable of compressing one, two or all of the N demodulated audio signals coming from demodulator module 240. There are several commonly used audio compression formats. For example, the Motion Picture Expert Group (MPEG) has standardized several methods of encoding digital audio signals. The different methods are identified by different layer members. All layers offer s selection of compression ratios, that is, the output bit rate can be varied. The MPEG standards are currently used for audio signal broadcasting as well as for audio recording. Thus, the compression engine may support one or more of the compression formats such as WAV, MP3, AC3, WMA or AAC. The compressed audio signals are then stored in storage unit 260. Digital processing module 250 also includes a decompression engine (not shown) that is capable of decompressing one or more compressed audio signals that are stored in storage unit 260. The format of compression and decompression can be performed under pre-installed software programs or according to control commands provided by the user via control circuitry 170. The compression engine may also be required to decode a received digital data stream that was originally transmitted in an encoded format.

In an embodiment, digital signal processing module 250 may also include an RDS/RBDS decoder for decoding RDS data contained in the demodulated data stream. The Radio Data System (RDS) is a system for transmitting data along with FM programs. The RDS broadcasting standard is designed by the European Broadcasting Union to provide information, such as the station name and what is currently aired to FM radio displays. A variation of the RDS standard, called Radio Broadcast Data System (RBDS), is later adopted by the National Radio Systems Committee in the United States. The transmitted data of the RDS/RBDS system, which is not audible, provides a variety of features such as: Program Identification code (PI), Program Service Name (PS), Program Type Display (PTY), Traffic Announcement Standby (TA), the music/speech flag (MS), etc. The program type PTY, for examples, displays the types of currently broadcasted programs such as news, sports programs, pop music, rock music, classics music, jazz, country music, etc. The RBDS decoder parses broadcast information associated with the demodulated audio data stream and stores the information in a first section of storage unit 260 while generating a pointer that refers to the storage address of the corresponding audio data stream stored in a second section of storage unit 260. In an embodiment, the RBDS decoder may include multiple digital decoding circuits that operate in parallel to determine the broadcast information of radio broadcasts in the entire radio spectrum in the digital domain. In another embodiment, the RBDS decoder may decode the broadcast information sequentially using a high speed processor. In an embodiment, digital signal processing circuitry 250 may contain software program codes for scanning the entire radio spectrum, which has been digitally captured by the wideband radio receiver in order to assess the occupancy, identity, and contents of the entire radio spectrum efficiently. In another embodiment, digital signal processing circuitry 250 may generate a database directory for the audio data streams stored in the second section of storage unit 260 based on the RBDS information stored in the first section of storage unit 260. For example, the database may include a directory of all stored audio streams based on the music/speech flag, the program identification code, the program service name, or the program type stored in the first section of storage unit 260. The user can access the directory through control circuitry 170 that may include a microprocessor or microcontroller running software program codes for managing this directory.

In another embodiment, wideband radio recorder 200 may provide a menu to the user for presetting or programming the recorder. For example, the user may preselect all desired radio channels of interests that will be recorded. The user can also activate the traffic announcement standby (TA) feature so that the user will receive traffic announcements automatically, independent from the actual source the user is listening to. The TA feature is shown as the broken line "bypass" in FIG. 2B.

In an embodiment, digital signal processing circuitry 250 is coupled to an output unit 280 that may include an audio amplifier for playback. In another embodiment, output unit 280 may include a wired port such as a USB, a FireWire interface, or a wireless link (e.g., WiFi according to the 802.11a/b/g/n standard, Bluetooth) that transmits the audio data stream including the associated RBDS information to a third-party device such as a portable music player (e.g., Microsoft's Zune, Apple's iPod, iPhone, Nano).

Storage unit 260 can be an optical disc, a magnetic tape recorder, a cassette recorder, a floppy disk, a hard-disk, a flash memory, static or dynamic RAM.

Figure 4:
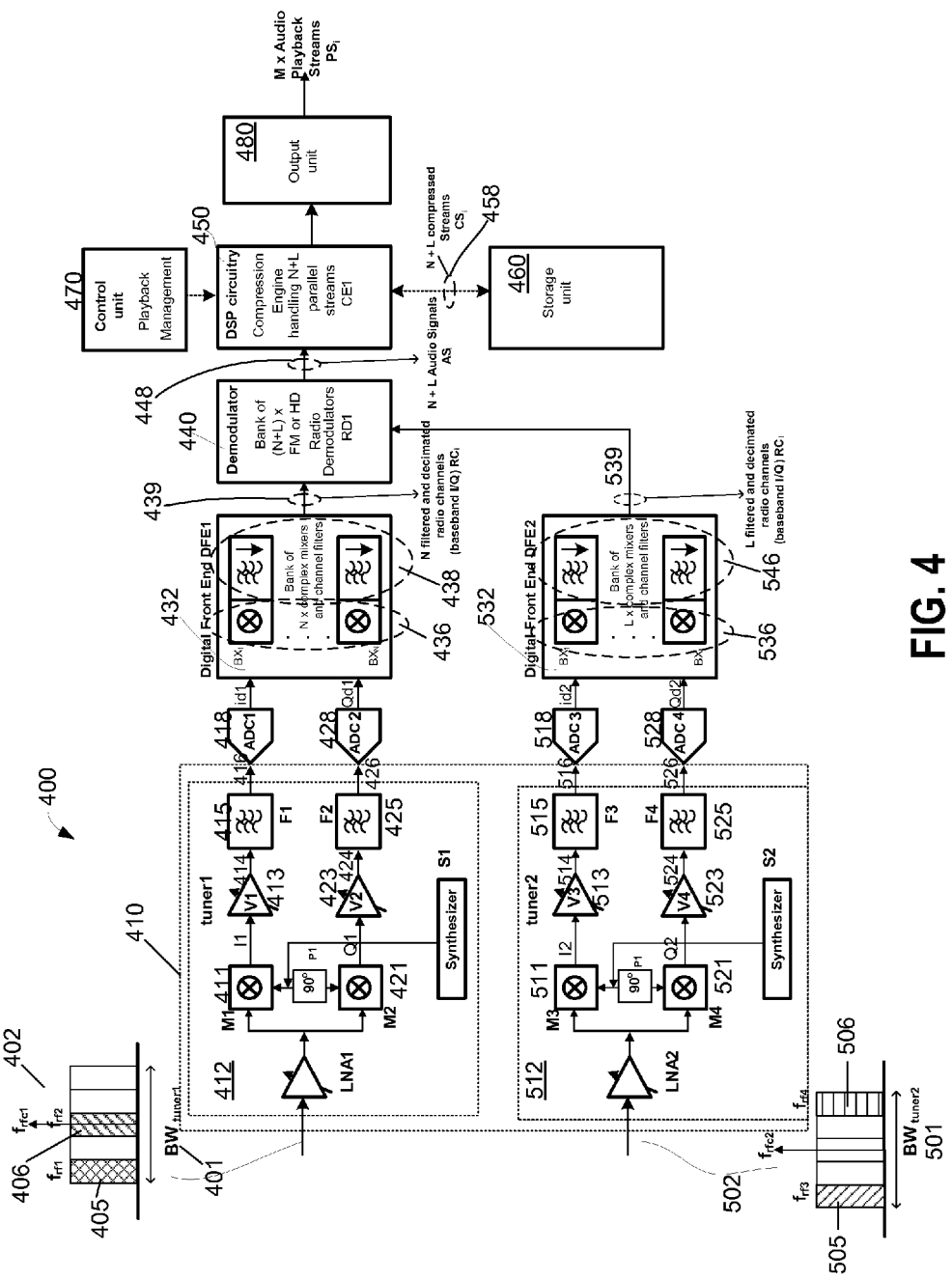
FIG. 4 is a simplified schematic block diagram of a wideband personal radio recorder having a multi-tuner receiver according to another embodiment of the present invention.

FIG. 4 is a simplified block diagram of a wideband personal radio recorder 400 having a multi-tuner receiver 410 according to another embodiment of the present invention. Multi-tuner receiver 410 includes a tuner1 412 and a tuner2 512. Tuner1 412 includes a low noise amplifier LNA1 that filters and amplifies a first portion BWtuner1 401 of a broad frequency spectrum that contains a first plurality of RF channels 402 including desired channels 405, 406 having respective channel frequencies $f_{rf1}$ and $f_{rf2}$. In an embodiment, the broad frequency spectrum is the FCC licensed FM band. A synthesizer S1 produces a local oscillation frequency that is centered about the BWtuner1 bandwidth 401. The first portion of the broad frequency spectrum BWtuner1 is then frequency down-converted to a low-IF or zero-IF in-phase signal I1 and a quadrature signal Q1 through respective mixer M1 411 and M2 421. Signals I1 and Q1 are further amplified by amplifiers V1 413, V2 423 and low-pass or band-pass filtered with filters F1 415 and F2 425 to eliminate unwanted frequency components of respective signals 414 and 424. Subsequent analog-to-digital converters ADC1 418 and ADC2 428 digitize signals 416 and 426 to obtain their respective digital representations Id1 and Qd1.

Digital signals Id1 432 and Qd1 442 are then provided to a digital front end DFE1 432 that includes a bank of N complex mixers 436 and an associated bank of channel filters and decimators 438. The bank of N complex mixers 436 has N identical digital complex down-mixer, where N is an integer value equal to the number of desired channels located in the first portion 401 of the broad frequency spectrum. In an embodiment, each one of the bank of N complex mixers 436 includes four digital multipliers that multiply the digital Id1 and Qd1 streams with a digitized cosine and a digitized sine to produce the sum and difference frequency components, as shown and described in FIG. 3. The digitized cosine and sine frequency, i.e., the mixer frequency is chosen to move the signals Id1 and Qd1 to a baseband 439. In an embodiment, DFE1 432 further includes digital low-pass filters 330 and 340 that eliminates unwanted high frequency components of the baseband signals I and Q prior to applying them to a decimator (shown as decimator 350 in FIG. 3) that reduces the sample frequency without any loss of information since Id1 and Qd1 are sampled at a much higher frequency by respective ADC1 418 and ADC2 428.

The decimated channels are then provided to demodulator module 440 that includes a plurality of demodulators.

Similarly, tuner2 512 includes a low noise amplifier LNA2 that amplifies a second portion BWtuner2 501 of the FCC licensed broad frequency spectrum. The second portion BWtuner2 501 contains a second plurality of RF channels 502 including a second number of desired channels 505, 506. In the exemplary illustration of FIG. 4, the second portion has a frequency bandwidth of BWtuner2 501 that contains desired channels 505, 506 having respective channel frequencies $f_{rf3}$ and $f_{rf4}$. Tuner2 512 includes elements such as a synthesizer S2 that generates a local oscillator frequency centered about the BWtuner2 bandwidth, mixers M3 511, M4 521, amplifiers V3 513, V4 523, filters F3 515, F4 525 and analog-to-digital converters ADC3 518 and ADC4 528 that are substantially the same as the like-named elements of the signal path of tuner1 412. The second portion of the broad frequency spectrum BWtuner2 is then frequency down-converted to a low-IF or zero-IF in-phase signal I2 and a quadrature signal Q2 through respective mixer M3 511 and M4 521. Signals I2 and Q2 are further amplified by amplifiers V3 513, V4 523 to provide amplified signals 514 and 524 that are further low-pass or band-pass filtered with filters F3 515 and F4 525. Filtered signals 516 and 526 are respective filtered signals 514 and 524 without the unwanted frequency components of signals 514, 524.

Digital in-phase signal Id2 and digital quadrature signal Qd2 are then provided to digital front end DFE2 532. DFE2 532 includes a bank of L complex filters 536 that transform signals Id2 and Qd2 to baseband signals that are further coupled to a bank of individual filters and decimators 546 for low-pass filtering and reducing the sampling rate of signals Id2 and Qd2 to a baseband signal 539. The elements of DFE2 532 are substantially similar to those described in DFE1 432. Thus, redundant description is omitted herein.

In an embodiment, tuners 412 and 512 may share the same antenna directly or through a splitter. In another embodiment, tuners 412 and 512 may have different antennas. The first and second portions BWtuner1 401 and BWtuner2 501 of the broad frequency spectrum may overlap. In another embodiment, they may not overlap. In yet another embodiment, the broad frequency spectrum may be the FCC licensed FM frequency spectrum spanning from 87.5 MHz to 107.9 MHz, and the first and second portions may cover the entire FM spectrum. In another embodiment, the first and second portions may not cover the entire FM spectrum. In an embodiment, the first and second portions may contain the same number of desired FM channels. In another embodiment, the first and second portions may not contain the same number of desired FM channels. For example, the user may want to record N channels that are located in the first portion and L channels that are located in the second portion of the FM spectrum. In this case, only N complex mixers with corresponding mixer frequencies will be activated in DFE1 432 and L complex mixers with corresponding mixer frequencies will be activated in DFE2 434. A total number of (N+L) decimated radio channels will be provided to demodulator 440 that will produce (N+L) demodulated data streams to digital signal processing circuitry 450.

Digital signal processing circuitry 450 may encode (compress) all, none, or certain demodulated data streams 448 according to standard compressed audio formats. The compressed data streams 458 are then time-multiplexed and stored in storage unit 460. As described above, digital signal processing circuitry 450 may include an RDS/RBDS decoder for parsing broadcast information embedded in the demodulated audio data streams. The parsed channel information data is then stored in a first section of storage unit 260 to form a database containing directories of some relevant parameters preset by the user, such as the program service name, the program type, etc. Each entry of the directory may also include an address pointer pointing to a second area of the storage unit that stores the associated audio content, compressed or uncompressed based on commands received from the user. The directory provides an overview of all stored contents to the user in a GUI format so that the user can interact with recorder 400 such as consume (playback), delete, or transmit selected contents to a third-party device.

The user can decide to record all available channels in the FM band at once, or to record a subset of channels (e.g., favorite channels) to conserve storage space. The user may select to record programs that have strong received signal strength. As described above, recorder 400 may include a built-in battery (not shown), so that the recording can continue even when an external power source is shut off. This is the case where recorder 400 is a part of the car stereo equipment, and the car is parked with its engine turned off. Recorder 400 may include a real-time clock to allow the user to preset a recording time. Recorder 400 may include a control unit 470 to allow a user to program the recording and playback. Recorder 400 may include an output unit 480 that can output the stored audio contents to a third-party device via a wired connection or a wireless link.

Thus, by capturing the entire band of the frequency modulation (FM) frequency spectrum, the present invention enables the user to select without limitation to select without limitation among all available channels for both listening and recording. The user can allocate the available storage space in the multimedia recorder according to his/her preference. If there is sufficient storage space, the user may choose to record all broadcast channels for late consumption. The user may also have the options to delete any stored content that he or she decides not to keep.

In an embodiment, the present invention provides the following usage scenario: The user scans the FM radio band and finds a broadcast of a song or program of interest. The user can then playback the entire song or program by "rewinding" that particular broadcast to its starting point for playback. Alternatively, the user may scan further back to listen for other content of interest. Later, the user may return at any time to "real time." The storage may occur on a low-cost flash memory device in a format which allows the memory device to be used in third-party stereo playback devices in the form of a podcast.

In another embodiment, the present invention permits the recording of a broadcast program to be set at a time where the user is not available so he or she can program (preset) the recorder to receive and record the desired program in advance. In yet another embodiment, the present invention allows the user to program the recorder to record all desired programs based on the Radio Broadcast Data Service (RBDS) information.

While several embodiments in accordance with the present invention have been described, it is to be understood that the above description is intended to be illustrative and not restrictive. Many embodiments will be apparent to those of skill in the art upon reviewing the above description. The scope of the invention should, therefore, be determined not with reference to the above description, but instead should be determined with reference to the appended claims along with their full scope of equivalents.

What is claimed is:

1. A wideband multimedia recorder for recording a plurality of radio channels comprising:
   a low-noise amplifier configured to concurrently receive a radio frequency signal associated with the plurality of radio channels;
   a first mixer configured to generate an in-phase signal from the radio frequency signal;
   a second mixer configured to generate a quadrature-phase signal from the radio frequency signal;
   an analog-to-digital converter configured to digitize the in-phase and quadrature-phase signals;
   a digital front end module configured to frequency down-convert the digitized in-phase and quadrature phase signals to a plurality of baseband radio channels;
   a demodulator configured to demodulate the plurality of baseband radio channels to generate a plurality of data streams;
   a digital signal processing circuitry configured to process the plurality of data streams;
   a storage unit configured to store the plurality of processed data streams; and
   a control configured to receive control commands from a user.

2. The recorder of claim 1 further comprising a filter adapted to filter the in-phase and quadrature phase signals.

3. The recorder of claim 1 further comprising:
   a frequency synthesizer configured to generate an oscillating signal applied to the first and second mixers.

4. The recorder of claim 1 wherein the digital front end comprises a plurality of mixers each associated with one of the baseband radio channels.

5. The recorder of claim 4 wherein each one of the plurality of mixers disposed in the digital front end is a digital complex mixer comprising four digital multipliers and two digital adders.

6. The recorder of claim 1 wherein the digital front end module further comprises a decimator configured to decimate each one of the plurality of radio channels in the baseband.

7. The recorder of claim 1 wherein the demodulator comprises a plurality of frequency modulation (FM) demodulators.

8. The recorder of claim 1 wherein the digital signal processing circuitry comprises at least one compression engine configured to encode the demodulated plurality of data streams in accordance with a compression algorithm.

9. The recorder of claim 8 wherein said compression algorithm is selected from a group consisting of WAV, MP3, AC3, WMA, AAC audio compression algorithms.

10. The recorder of claim 9 wherein the digital processing circuitry comprises at least a decompression engine configured to decompress one of the stored data streams.

11. The recorder of claim 1 wherein the storage unit is selected from a group consisting of an optical compact disc, magnetic hard-disk, or flash memory.

12. The recorder of claim 1 wherein the control circuitry manages playback and recording operations based on the user's control commands.

13. The recorder of claim 12 wherein the playback is performed on a third-party device.

14. The recorder of claim 1 further comprising a battery configured to supply power to the recorder for continual operation in the event that an external power supply is turned off.

15. The recorder of claim 1 further comprising an RBDS decoder for parsing radio broadcast data service information embedded in the plurality of data streams.

16. The recorder of claim 15 wherein the act of parsing comprises determining an occupancy, a location, an identity, and/or content that is associated with at least one of the plurality of data streams.

17. The recorder of claim 15 wherein the RBDS decoder comprises a plurality of digital decoding circuits operating in parallel.

18. The recorder of claim 15 wherein the parsed radio broadcast data service information is stored in a first section of the storage unit.

19. The recorder of claim 1 further comprising an output unit configured to transmit wirelessly at least one of the plurality of data streams in response to a user's control commands.

20. A method of recording a plurality of radio channels with a wideband receiver comprising:
receiving a radio frequency signal associated with a plurality of radio channels;
mixing the radio frequency signal to generate an in-phase signal and a quadrature-phase signal;
digitizing the in-phase and quadrature-phase signals;
frequency-shifting the digital in-phase and quadrature-phase signals to a plurality of baseband radio channels;
demodulating the plurality of baseband radio channels to generate a plurality of data streams;
and
storing the plurality of data streams.

21. The method of claim 20 further comprising:
filtering the frequency-shifted digital in-phase and quadrature-phase signals.

22. The method of claim 20 further comprising:
retrieving the stored plurality of data streams in response to a user command.

23. The method of claim 20 further comprising:
encoding the plurality of data streams prior to storing thereof; and
decoding the stored plurality of data streams.

24. The method of claim 20 further comprising:
parsing radio broadcast data service (RBDS) information embedded in the plurality of data streams;
storing the radio data service information; and
building a directory based on the stored RBDS information.

25. The method of claim 24 wherein the parsing comprises determining an occupancy, a location, an identity, and/or content associated with at least one of the plurality of data streams.

26. The method of claim 20 further comprising:
transmitting wirelessly, in response to user's control commands, at least one of the plurality of data streams.

* * * * *